(12) United States Patent
Handy et al.

(10) Patent No.: US 9,915,694 B2
(45) Date of Patent: Mar. 13, 2018

(54) METHOD FOR DETECTING ELECTRICAL FAULTS IN A CIRCUIT

(71) Applicant: GE AVIATION SYSTEMS LIMITED, Cheltenham, Gloucestershire (GB)

(72) Inventors: Peter James Handy, Cheltenham (GB); Adrian Shipley, Cheltenham (GB)

(73) Assignee: GE AVIATION SYSTEMS LIMITED (GB)

( * ) Notice: Subject to any disclaimer, the term of this patent is extended or adjusted under 35 U.S.C. 154(b) by 0 days.

(21) Appl. No.: 15/038,114

(22) PCT Filed: Nov. 22, 2013

(86) PCT No.: PCT/GB2013/053082
§ 371 (c)(1),
(2) Date: May 20, 2016

(87) PCT Pub. No.: WO2015/075410
PCT Pub. Date: May 28, 2015

(65) Prior Publication Data
US 2016/0291073 A1    Oct. 6, 2016

(51) Int. Cl.
*G01R 31/02* (2006.01)
*H02H 3/16* (2006.01)
(Continued)

(52) U.S. Cl.
CPC ......... *G01R 31/025* (2013.01); *G01R 31/008* (2013.01); *G01R 31/1272* (2013.01); *H02H 1/0015* (2013.01); *H02H 3/16* (2013.01)

(58) Field of Classification Search
CPC .............. G01R 31/025; G01R 31/008; G01R 31/1272; H02H 3/16; H02H 1/0015
See application file for complete search history.

(56) References Cited

U.S. PATENT DOCUMENTS 8,842,398 B2    9/2014  Shipley et al.
9,046,588 B2 *  6/2015  Behrends ............. H02H 1/0015
(Continued)

FOREIGN PATENT DOCUMENTS

CN       1841074 A    10/2006
CN     102959410 A     3/2013
(Continued)

OTHER PUBLICATIONS

PCT Search Report and Written Opinion issued in connection with corresponding PCT Application No. PCT/GB13/053082 dated Apr. 22, 2014.
(Continued)

*Primary Examiner* — Jermele M Hollington
*Assistant Examiner* — Zannatul Ferdous
(74) *Attorney, Agent, or Firm* — GE Global Patent Operation; William S. Munnerlyn

(57) ABSTRACT

A method for detecting electrical faults in an electrical circuit having transmission wires for power transmission includes determining whether a potential electrical fault condition exists along the transmission wires and confirming the potential electrical fault is an actual electrical fault. If the potential electrical fault is confirmed as an actual electrical fault, the method may disable the electrical circuit.

13 Claims, 2 Drawing Sheets

(51) Int. Cl.
*H02H 1/00* (2006.01)
*G01R 31/00* (2006.01)
*G01R 31/12* (2006.01)

(56) References Cited

U.S. PATENT DOCUMENTS

| | | | |
|---|---|---|---|
| 2011/0292555 | A1 | 12/2011 | Shipley |
| 2012/0280717 | A1 | 11/2012 | Fu |
| 2013/0057997 | A1* | 3/2013 | Dent .................... G01R 31/024 |
| | | | 361/118 |
| 2013/0170084 | A1 | 7/2013 | Strobl et al. |
| 2014/0306717 | A1* | 10/2014 | Feenstra ................ G01R 31/08 |
| | | | 324/543 |

FOREIGN PATENT DOCUMENTS

| | | |
|---|---|---|
| GB | 2518592 | 4/2015 |
| JP | 2005-117750 A | 4/2005 |
| WO | 0239561 A2 | 5/2002 |
| WO | 2013171329 A1 | 11/2013 |

OTHER PUBLICATIONS

Unofficial English Translation of Japanese Office Action issued in connection with corresponding JP Application No. 2016532026 dated Jun. 27, 2017.

Unofficial English Translation of Office Action issued in connection with related CN Application No. 201380081098.1 dated Nov. 16, 2017.

* cited by examiner

METHOD FOR DETECTING ELECTRICAL FAULTS IN A CIRCUIT

BACKGROUND

Electrical systems, such as those found in an aircraft power distribution system, employ electrical bus bars and miles of wiring for delivering power from electrical power sources to electrical loads. In the event of an electrical arc fault or other failure condition, high currents may be transmitted through a normally nonconductive medium, such as air, resulting in unexpected operations of the power distribution system at or about the arcing failure point.

BRIEF DESCRIPTION

A method for detecting electrical faults in an electrical circuit having transmission wires for power transmission, the method includes a first sensing of at least one of a voltage or a current along at least one of the transmission wires, determining a potential electrical fault condition based on the sensed at least one of the voltage and current and reducing the power transmission along the at least one of the transmission wires below a first predetermined threshold. After the reducing, the method includes a second sensing of at least one of a voltage or a current along the at least one of the transmission wires, comparing the sensed at least one of the voltage or current against a corresponding voltage or current threshold, and determining an electrical fault has occurred when a characteristic of the second sensed at least one of voltage or current satisfies a corresponding voltage or current threshold.

DETAILED DESCRIPTION

The described embodiments of the present innovation are directed to an electrical power distribution system, which may be used, for example, in an aircraft. While this description is primarily directed toward a power distribution system for an aircraft, it is also applicable to any environment using an electrical system for transmitting power from a power source to an electrical load.

Figure 1:
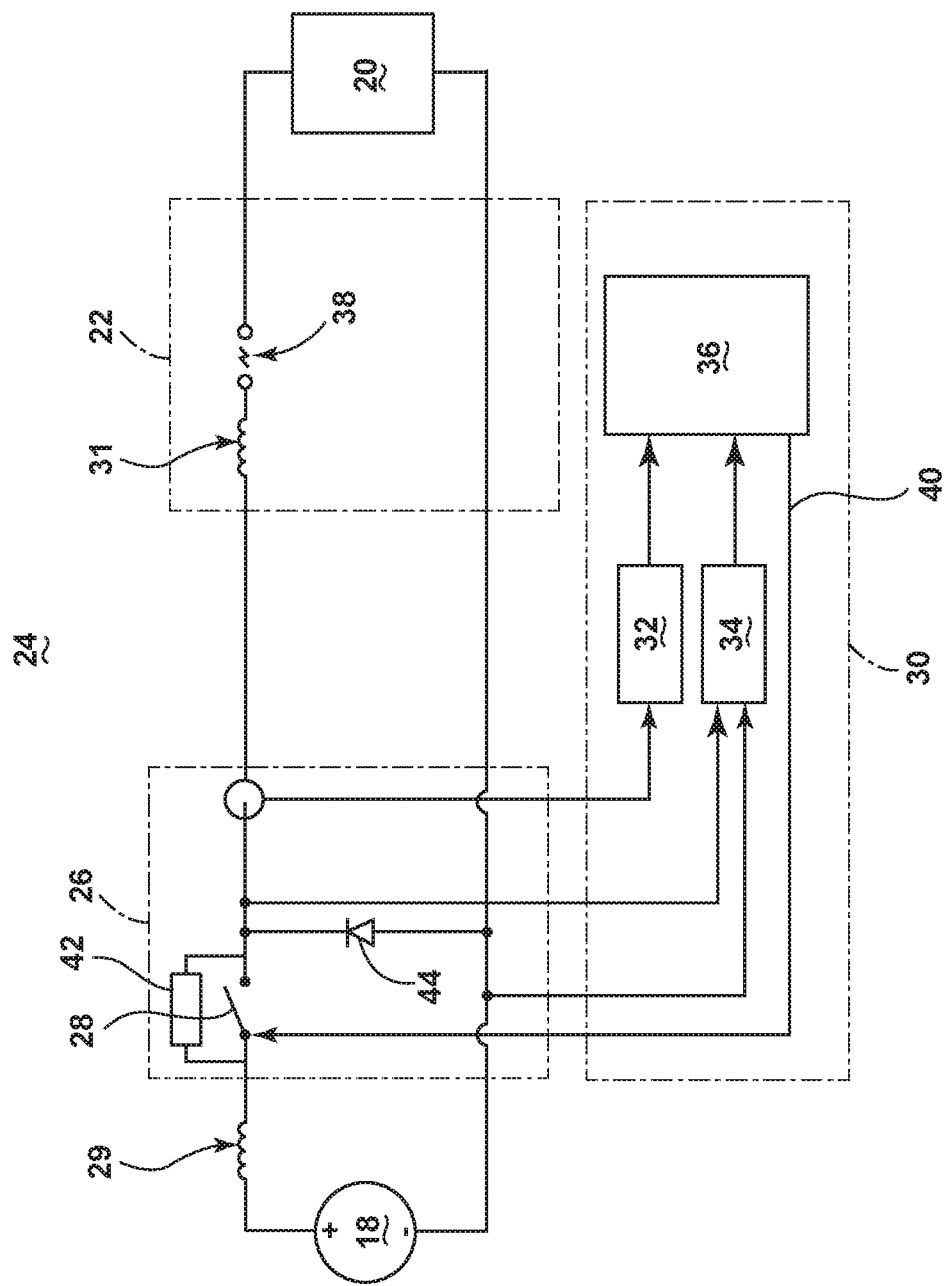
FIG. 1 is a schematic circuit diagram of a power distribution system in accordance with various aspects described herein.

FIG. 1 illustrates an exemplary schematic circuit diagram of a power distribution system 24, such as an exemplary power distribution system in an aircraft, comprising a generator 18, an electrical switch, such as a solid state switch 26, electrical interconnects, such as electrical transmission wires 22, cables, cable junctions, or bus bars, an electrical load 20, and an arc event detector 30. As shown, the generator 18 is electrically coupled with the solid state switch 26, which is further electrically coupled to the arc event detector 30 and the electrical load 20, via the transmission wires 22. The solid state switch 26 may include a switching component 28, a transient suppression device configured across the switching component 28, such as a transorb 42, and a diode 44 biased from, for example, electrical ground to the power line, downstream from the switching component 28. As shown, the power distribution system 24 may also include a first inductance 29, for example an inherent generator 18 inductance, positioned near the generator 18, and a second inductance 31, for example, an inherent transmission wire 22 inductance. For illustrative purposes, the transmission wires 22 are further shown having an example series transient electrical event 38, such as an arc fault.

In an aircraft embodiment, for example, an operating gas turbine engine may provide mechanical energy which may be extracted via a spool, to provide a driving force for the generator 18. The generator 18, in turn, provides the generated power to the solid state switch 26, which deliver the power to the electrical loads 20, via the transmission wires 22, when the switching component 28 is closed. When the switching component 28 is opened, the interruption of the current in the power distribution system 24 causes a current decay across the transorb 42 as the transorb 42 suppresses the transient electrical signal generated by the configuration of the diode 44 and the first and second inductances 29, 31.

Additional power sources for providing power to the electrical loads 20, such as emergency power sources, ram air turbine systems, starter/generators, or batteries, are envisioned. It will be understood that while one embodiment of the innovation is described in an aircraft environment, the innovation is not so limited and has general application to electrical power systems in non-aircraft applications, such as other mobile applications and non-mobile industrial, commercial, and residential applications.

One example of the solid state switch 26 may comprise a silicon carbide (SiC) or Gallium Nitride (GaN) based, high bandwidth power switch. SiC or GaN may be selected based on their solid state material construction, their ability to handle large power levels in smaller and lighter form factors, and their high speed switching ability to perform electrical operations very quickly. Another example of the solid state switch 26 may comprise further silicon-based power switch, also capable of high speed switching.

The arc event detector 30 may further comprise a current sensor 32 capable of sensing and/or measuring the electrical current characteristics of the current flowing through the power distribution system 24, a voltage sensor 34 capable of measuring the voltage characteristics of the system 24, and a processor 36. The arc event detector 30 may further provide a control signal 40 from the processor 36 to the switching component 28, wherein the control signal 40 is capable of controlling the switching component 28, and thus, controlling the operation of the solid state power switch 26.

Each of the current and voltage sensors 32, 34 provide the respective sensed current and/or voltage characteristic to the processor 36. Example current characteristics measurable may include, but are not limited to, instantaneous current, average current, or rate of change in current. Likewise, example voltage characteristics measurable may include, but are not limited to, instantaneous voltage, average voltage, of rate of change in voltage. While each of the current sensor 32 and voltage sensor 34 are illustrated measuring the respective current and voltage characteristics at the solid state switch 26, other measurement locations are envisioned so long as the measurements are captured downstream from the switching component 28. While the current and/or voltage sensors 32, 34 are described as "sensing" and/or "measuring" the respective electrical current and voltage characteristics of the power distribution system 24, it is envisioned that sensing and/or measuring may include the determination of a value indicative or related to the electrical current and/or voltage characteristics, and not the actual current and/or voltage values. It is also envisioned the current and/or voltage sensors 32, 34 may provide a respective current and/or voltage characteristics, as described above, and the processor 36 performs processing on the characteristics. Additionally, an alternative configuration is envisioned wherein the current and voltage sensors 32, 34 are integrated with the processor 36.

Electrical arcs may occur in an environment where, for example, physical defects in an electrical connection cause a permanent or temporary loss in transmission capabilities. Where a physical separation occurs, the voltage difference between each of the separated terminals in addition to a short distance of separation, may allow for an electrical arc to strike between the terminals. The electrical system may see the electrical arcing event as a sudden or short current reduction, caused by the voltage drop across the separation. In an environment with vibrations, for instance, as an aircraft, a physical defect in an electrical connection may cause temporary arcing events as the vibrations may reconnect and disconnect the electrical connection at the point of the physical defect.

The arc event detector 30 operates by providing the current and/or voltage characteristics of the power distribution system 24, as measured by the respective current and/or voltage sensors 32, 34, to the processor 36. The processor 36 makes a determination whether a suspected electrical fault, such as an arc fault (hereinafter referred to as an arcing event), is occurring or has occurred, based on the current and/or voltage characteristics. For example, the processor 36 may compare the current and/or voltage characteristics to a predetermined arcing event profile, which may be stored in a memory of the processor 36 or readable by the processor 36. The processor 36 may then provide a control signal 40 to the solid state switch 26 to operate the switching component 28 based on the detection of the event.

While only a single generator 18, solid state switch 26, set of transmission wires 22, electrical load 20, and arc event detector 30 are illustrated for ease of understanding, alternate power distribution systems 24 are envisioned having one or more of the aforementioned components 18, 20, 22, 26, 30 configured to define a robust power distribution system 24, or network of systems 24. For example, alternative configurations are envisioned having more than one electrical load 20 coupled to each solid state switch 26, more than one set of transmission wires 22 configured in series or parallel, or more than one solid state switch 26 configured to selectively couple multiple sets of transmission wires 22 to additional portions of the power distribution system 24.

The method of detecting electrical faults in the power distribution system 24 includes first determining a suspected or potential electrical fault in the system 24, then reducing the power transmission along the transmission wires 22 to below a first predetermined power transmission threshold capable of creating an arcing event, while sensing power transmission characteristics of the system 24, for example, using the current and voltage sensors 32, 34. After a predetermined period of time, the power distribution system 24 simultaneously increases the power transmission along the transmission wires 22 to a power transmission level above the predetermined threshold while again sensing power transmission characteristics of the system 24. The power distribution system 24 determines and/or confirms if the suspected or potential electrical fault is an actual electrical fault based on the sensed power transmission characteristics during this process, for example, if the system 24 detects a sudden drop of the system current to zero, or if the system 24 detects a sufficient time delay between increasing the power transmission along the transmission wires 22 and the corresponding increase of the power transmission characteristics to a second predetermined threshold. The time delay may be sufficient if the delay satisfies a, for example, predetermined time delay threshold. The method may allow for the above-described process to run multiple times in order to improve a 'confidence' of, to estimate the presence of, or to confirm the presence of, an electrical arcing event.

Figure 2:
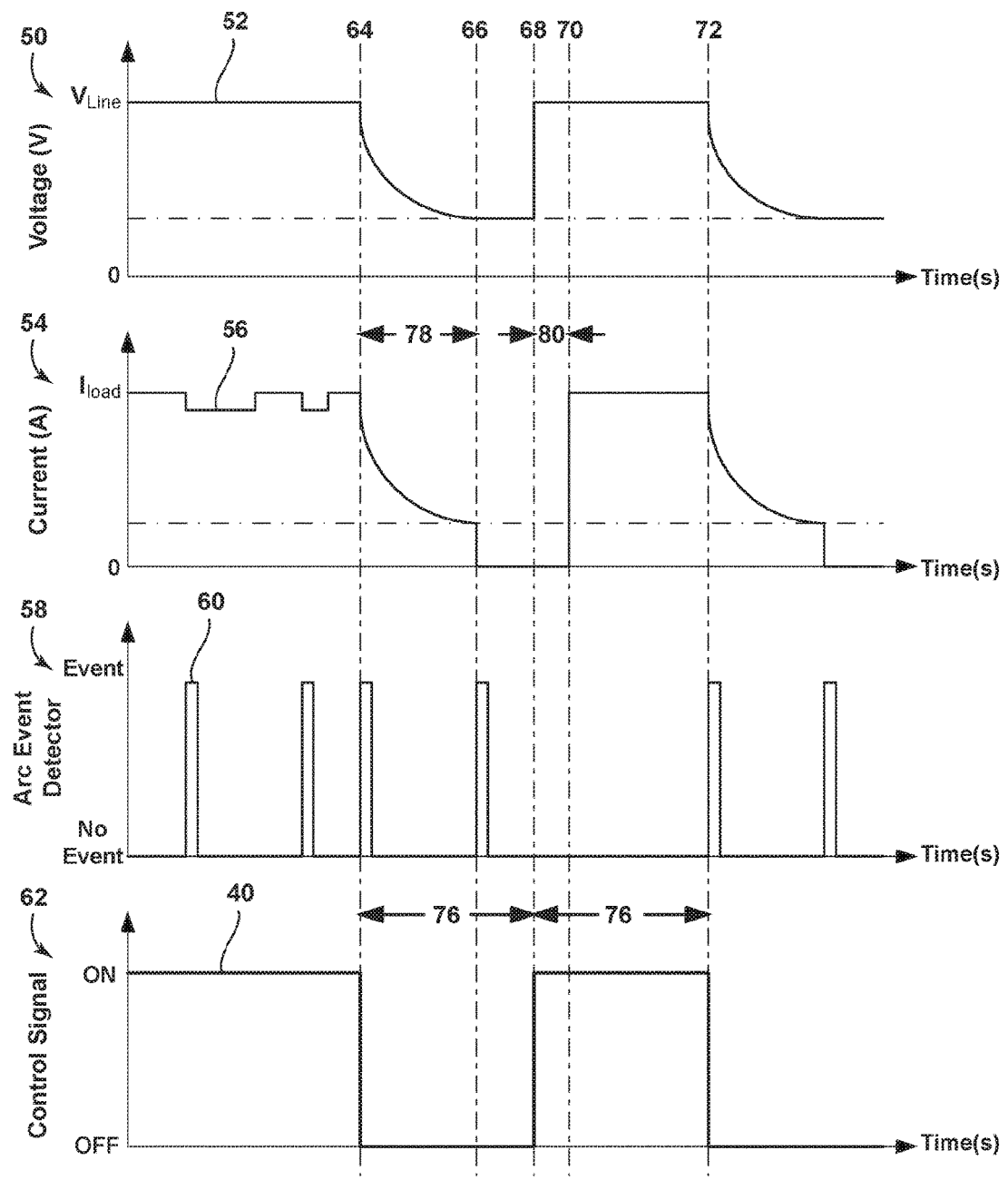
FIG. 2 is a series of graphs showing the fault detection response of the power distribution system, in accordance with various aspects described herein.

One embodiment of the power distribution system 24 operation may be further understood with reference to the time-aligned graphs presented in FIG. 2. As illustrated, a first graph 50 showing the transmission line voltage signal 52 as measured by the voltage sensor 34 downstream of the switching component 28, a second graph 54 showing the power distribution system current signal 56 as measured by the current sensor 32, a third graph 58 showing the event determination 60 by the arc event detector 30, and a fourth graph 62 showing the control signal 40 generated by the arc event detector 30 in response to the detection of an arcing event.

The graphs 50, 54, 58, 62 additionally illustrate sequential corresponding time values of a first time instance 64, and a second time instance 66, a third time instance 68, a fourth time instance 70, and a fifth time instance 72. The difference between the first time instance 64 and the third time instance 68 defines a interval time period 76 between cycling the switching components 28 from "ON" to "OFF" (or vice versa). Additionally, the difference between the first and second time instances 64, 66 defines a quench time period 78 sufficient to predictably "quench" an arc fault, that is, to discharge any remaining possible arcing events due to an electrical fault.

At the start of the method, the power distribution system 24 is operating, possibly with an arcing electrical fault. As shown, the control signal 40 provides an "ON" signal, and thus, the solid state switch 26 allows power (represented by the voltage and current signals 52, 56) to flow from the generator 18 to the electrical load 20. Between the start of the method and a first time instance 64, at least one change in the current signal 56 occurs. This change in the current signal 56 may exemplify a break in a continuous arcing fault, wherein the drop in current may represent a strike of the electrical arc and the corresponding drop in current due to the strike, as explained above. As illustrated, the arc event detector 30 determines the changes in the current signal 56 are sufficient for the processor 36 to determine a suspected arcing event is taking place, as represented by the event determination 60 of the third graph. Stated another way, a strike in the electrical arc may be used to define the event determination 60. Non-limiting examples of an electrical arc that may be used to define the event determination may include an unexpected drop in current or an unexpected drop in voltage in the power distribution system 24. Alternative electrical characteristics defining the event determination are envisioned After a sufficient number of events are detected, the arc event detector 30 attempts to confirm the presence of an arc fault by cycling the solid state switch 26. The arc event detector 30 cycles the solid state switch 26 by generating an "OFF" control signal 40 simultaneously with the determination of the next event (e.g. the next strike in the electrical arc), followed by generating an "ON" control signal 40 after at least the interval time period 76.

As illustrated, the next event determination occurs at the first time instance 64. At this first time instance 64, the "OFF" control signal 40 opens the switching component 28 of the solid state switch 26, and thus, results in a decay of the voltage and current signals 52, 56, due to the transorb 42 configuration, as explained above. As shown, the quench time period 78 is less than the interval time period 76, and thus, any arc event occurring will quench prior to the re-closing of the switching component 28, which occurs at the third time instance 68. The illustrated example shows the quenching of the arc event at the second time instance 66, wherein the current suddenly drops to zero amps. The arc event detector 30 may use the sudden change in electrical characteristics caused by the quenching of the arch, as indicated by the voltage and/or current signals 52, 56, to confirm an arcing event is occurring on the transmission wires 22. Conversely, a power distribution system 24 without an electrical fault would detect, for instance, a decaying current signal 56 that would predictably decay to zero amps, rather than suddenly falling to zero amps. The indicated voltage and/or current signals 52, 56 may be, for example, compared against an arc quench profile, or a current decay profile.

At the third time instance 68, an "ON" control signal 40 is generated and the solid state switch 26 closes the circuit, enabling power to flow through the power distribution system 24. In the scenario where no break in the transmission wires 22 exist, both the voltage and current signals 52, 56 will contemporaneously return to normal operating characteristics with the "ON" control signal 40, at the third time instance 68. However, in the illustrated scenario where, for example, a break in the transmission wires 22 or an arc fault exists in the power distribution system 24, there may be a measurable delay period 80 in at least one of the voltage or current signals 52, 56 between the third time instance 68 (i.e. the switch of the "ON" control signal 40) and the fourth time instance 70 (the moment wherein the voltage and/or current through the system 24 increases above a second predetermined threshold, shown as the previous transmission levels). This delay period 80 is exemplified in the second graph 54, wherein a delay in the current signal 56 is indicative of an arc failure. Stated another way, the delay period 80 is representative of the reclosing of a break in the transmission wires 22, which may also be indicative of an electrical fault. While the delay period 80 is presented in the context of the current signal 56, it is also possible for the delay to present with the voltage signal 52.

In the described method, either the quenching of the arc at the second time instance 66, or the detection of a delay period 80 may be used by the power distribution system 24 to confirm and/or build confidence that an electrical fault exists in the system 24. If an electrical fault is confirmed as described, the arc event detector 30 may take additional actions, such as permanently or temporarily disabling at least a portion of the power distribution system 24, or reducing the power delivered by the system 24 to reduce the impact of any continued arcing event. As shown, at the fifth time instance 72, the power distribution system 24 is disabled by generating an "OFF" control signal 40, which may or may not be timed with an arcing event, until the system 24 is inactive.

Any additional actions may be influenced by the criticality of the power distribution system 24, the electrical load 20, and/or the estimated danger imposed by any electrical fault confirmed, for example, as measured by the delay period 80. Additionally, the power distribution system 24 and/or the arc event detector may provide an indication of the electrical fault, such as a digital error message, audio indicator such as an alarm, or visual indicator such as a blinking light, to a user or another system. It is also envisioned the method may be run multiple times in order to confirm or to build confidence that a fault exists, prior to taking any actions, as described above.

The power distribution system 24 may also include one or more filtering components to filter out the noisy aspects of the voltage signal 52, current signal 56, and/or any electrical characteristics on the transmission wires 22, to prevent operating the method (i.e. interrupting the circuit) in response to false event detections. The reduced operation of the method in response to false event detections may avoid power distribution quality issues, or nuisance circuit tripping, associated with repeated interruptions.

In the event that no delay period 80 is measured at the third time instance 68, the control signal 40 remains "ON" and the power distribution network continues delivering power to the electrical loads 20. In one example, the method may reset to look for additional suspected electrical faults. Alternatively, the method may reset after a timed delay. An embodiment of the innovation is also envisioned wherein the interval time period 76 is less than a time period sufficient to cause an electrical load to enter a power interruption or reset condition. Stated another way, it is envisioned the time needed to confirm the presence of an arcing event is less than an amount of time that would cause and electrical load 20 interruption of operation. For example, RTCA DO-160G describes that a 270 VDC electrical system may support a power interruption of 50 ms, while the interruption time required for the above described methodology may be approximately 100 μs, which may have an insignificant effect on power quality.

While the described embodiment illustrates an example of a series arcing event, it is envisioned a parallel arcing event may be detected and confirmed using voltage and/or current characteristics, as measured against a parallel arcing profile, in a substantially similar configuration. Additionally, it is envisioned that embodiments of the innovation may be included at multiple points of a power distribution network such that a particular point or segment comprising the electrical failure may be determined, and, for instance, a power supply may be rerouting through an alternative electrical path to reach the electrical loads 20.

Many other possible embodiments and configurations in addition to that shown in the above figures are contemplated by the present disclosure. Additionally, the design and placement of the various components may be rearranged such that a number of different in-line configurations could be realized.

The embodiments disclosed herein provide a method for detecting electrical faults in a circuit. One advantage that may be realized in the above embodiments is that the above described embodiments provide for active detection of arcing electrical faults by confirming the fault, and thus reducing erroneous false-positive fault indications. Another advantage of the above described embodiments is that the method may be run multiple times in order to confirm the presence of an electrical fault before taking appropriate actions, and thus may improve power quality by reducing nuisance tripping events. The method may also employ filtering techniques to further reduce erroneous false-positive fault indications. Additionally, the method allows for uninterrupted electrical load operation in the event that a false-positive fault is indicated, but not confirmed.

Another advantage of the above described embodiments is that an arc event detector in an electrical system or network of arc even detectors in one or more electrical systems may be able to precisely define where an electrical fault is taking place. This may allow for a very robust system wherein arcing events may be quickly located (and safely interrupted) due to the proximity of one or more arc event detectors to any given failure point. Additionally, by locating the point of failure, the system may allow for rerouting of power around the fault (if available), providing redundancy in the electrical network. The above described embodiments, thus, provide for increased safety for an aircraft electrical power distribution system and hence improve the overall safety of the aircraft and air travel. Furthermore, precisely defining where an electrical fault is taking place reduces or eliminates any additional maintenance time and/or costs associated with having to manually test and locate the electrical failure.

Yet another advantage of the above described embodiments is that both series and parallel arc faults may be accurately detected by the electrical circuit, thus reducing or eliminating any local heat generated by arcing events, which may lead to an electrical fire, smoke, melting of or damage to components, or catastrophic failures of the electrical system or greater structure, such as an aircraft. Another advantage of the above described embodiments is that the method may prevent a series arc fault or faults from developing into parallel arc faults.

This written description uses examples to disclose the innovation, including the best mode, and also to enable any person skilled in the art to practice the innovation, including making and using any devices or systems and performing any incorporated methods. The patentable scope of the innovation is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for detecting electrical faults in an electrical circuit having transmission wires for power transmission, the method comprising:
   a first sensing of at least one of a voltage or a current along at least one of the transmission wires;
   determining a potential electrical fault condition based on the sensed at least one of the voltage and current;
   reducing the power transmission along the at least one of the transmission wires below a first predetermined threshold capable of creating an arcing event;
   increasing the power transmission along the transmission wires above the predetermined threshold after reducing;
   a second sensing of at least one of a voltage or a current along the at least one of the transmission wires;
   comparing the sensed at least one of the voltage or current against a corresponding voltage or current threshold; and
   determining an electrical fault has occurred when a characteristic of the second sensed at least one of voltage or current satisfies a corresponding voltage or current threshold;
   wherein satisfying a corresponding voltage or current threshold is indicative of a time delay between the voltage and current reaching a second predetermined threshold.

2. The method of claim 1, wherein detecting a potential electrical fault condition comprises detecting at least one of a series arc fault or a parallel arc fault.

3. The method of claim 1, wherein determining a potential electrical fault condition further comprises comparing the sensed at least one of the voltage or current to a predetermined fault profile.

4. The method of claim 1, wherein the satisfying a corresponding voltage or current threshold is indicative of an arc quenching event.

5. The method of claim 1, wherein the reaching a second predetermined threshold comprises the power transmission reaching the previous power transmission levels.

6. The method of claim 1, wherein increasing the power transmission occurs after a sufficient amount of time to quench any suspected electrical fault events.

7. The method of claim 1, wherein determining a potential electrical fault condition comprises determining a rate of change in the sensed at least one of the voltage and current.

8. The method of claim 7, wherein determining a potential electrical fault condition further comprises comparing the determined rate of change to a predetermined fault profile.

9. The method of claim 1, further comprising filtering out at least some signal from the at least one of the voltage and current prior to determining a potential electrical fault condition.

10. The method of claim 9, wherein the power transmission is reduced to zero.

11. The method of claim 1, wherein reducing the power transmission is timed to occur contemporaneously with a suspected electrical fault event.

12. The method of claim 1, further comprising at least one of disabling the electrical circuit or indicating a fault, upon determination of an electrical fault.

13. The method of claim 12, further comprising identifying where the electrical fault is located based on the indicating a fault.

* * * * *